(12) United States Patent
Gilton

(10) Patent No.: US 7,112,484 B2
(45) Date of Patent: Sep. 26, 2006

(54) THIN FILM DIODE INTEGRATED WITH CHALCOGENIDE MEMORY CELL

(75) Inventor: Terry L. Gilton, Boise, ID (US)

(73) Assignee: Micron Technology, Inc., Boise, ID (US)

(*) Notice: Subject to any disclaimer, the term of this patent is extended or adjusted under 35 U.S.C. 154(b) by 22 days.

(21) Appl. No.: 11/003,733

(22) Filed: Dec. 6, 2004

(65) Prior Publication Data
US 2005/0101084 A1 May 12, 2005

Related U.S. Application Data

(62) Division of application No. 10/121,794, filed on Apr. 10, 2002, now Pat. No. 6,855,975.

(51) Int. Cl.
*H01L 27/108* (2006.01)
(52) U.S. Cl. .................. 438/237; 438/542; 438/659; 438/702; 438/703; 438/761; 438/783
(58) Field of Classification Search .......... 438/84, 438/95, 102, 141, 237, 380, 514, 518, 542, 438/933, 979, 983, FOR. 291, FOR. 415, 438/530, 659, 700, 702, 703, 761, 778, 783, 438/914, FOR. 219
See application file for complete search history.

(56) References Cited

U.S. PATENT DOCUMENTS

| | | | |
|---|---|---|---|
| 3,271,591 A | 9/1966 | Ovshinsky |
| 3,622,319 A | 11/1971 | Sharp |
| 3,743,847 A | 7/1973 | Boland |
| 3,961,314 A | 6/1976 | Klose et al. |
| 3,966,317 A | 6/1976 | Wacks et al. |
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |

(Continued)

FOREIGN PATENT DOCUMENTS

JP 56126916 10/1981

(Continued)

OTHER PUBLICATIONS

Abdel-Ali, A.; Elshafie,A.; Elhawary, M.M., DC electric-field effect in bulk and thin-film Ge5As38Te57 chalcogenide glass, Vacuum 59 (2000) 845-853.

(Continued)

*Primary Examiner*—George Fourson
*Assistant Examiner*—Joannie Adelle Garcia
(74) *Attorney, Agent, or Firm*—Dickstein Shapiro Morin & Oshinsky LLP

(57) ABSTRACT

An integrated programmable conductor memory cell and diode device in an integrated circuit comprises a diode and a glass electrolyte element, the glass electrolyte element having metal ions mixed or dissolved therein and being able to selectively form a conductive pathway under the influence of an applied voltage. In one embodiment, both the diode and the memory cell comprise a chalcogenide glass, such as germanium selenide (e.g., $Ge_2Se_8$ or $Ge_{25}Se_{75}$). The first diode element comprises a chalcogenide glass layer having a first conductivity type, the second diode element comprises a chalcogenide glass layer doped with an element such as bismuth and having a second conductivity type opposite to the first conductivity type and the memory cell comprises a chalcogenide glass element with silver ions therein. In another embodiment, the diode comprises silicon and there is a diffusion barrier layer between the diode and the chalcogenide glass memory element. Methods of fabricating integrated programmable conductor memory cell and diode devices are also disclosed.

24 Claims, 8 Drawing Sheets

U.S. PATENT DOCUMENTS

| | | |
|---|---|---|
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A | 10/1998 | Harshfield |
| 5,825,046 A | 10/1998 | Czubatyj et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,031,287 A | 2/2000 | Harshfield |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolstenholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B1 | 5/2002 | Kozicki et al. |
| 6,391,688 B1 | 5/2002 | Gonzalez et al. |
| 6,404,665 B1 | 6/2002 | Lowery et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,429,064 B1 | 8/2002 | Wicker |
| 6,437,383 B1 | 8/2002 | Xu |
| 6,440,837 B1 | 8/2002 | Harshfield |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowery |
| 6,507,061 B1 | 1/2003 | Hudgens et al. |
| 6,511,862 B1 | 1/2003 | Hudgens et al. |
| 6,511,867 B1 | 1/2003 | Lowery et al. |
| 6,512,241 B1 | 1/2003 | Lai |
| 6,514,805 B1 | 2/2003 | Xu et al. |
| 6,531,373 B1 | 3/2003 | Gill et al. |
| 6,534,781 B1 | 3/2003 | Dennison |
| 6,545,287 B1 | 4/2003 | Chiang |
| 6,545,907 B1 | 4/2003 | Lowery et al. |
| 6,555,860 B1 | 4/2003 | Lowery et al. |
| 6,563,164 B1 | 5/2003 | Lowery et al. |
| 6,566,700 B1 | 5/2003 | Xu |
| 6,567,293 B1 | 5/2003 | Lowery et al. |
| 6,569,705 B1 | 5/2003 | Chiang et al. |
| 6,570,784 B1 | 5/2003 | Lowery |
| 6,576,921 B1 | 6/2003 | Lowery |
| 6,586,761 B1 | 7/2003 | Lowery |
| 6,589,714 B1 | 7/2003 | Maimon et al. |
| 6,590,807 B1 | 7/2003 | Lowery |
| 6,593,176 B1 | 7/2003 | Dennison |
| 6,597,009 B1 | 7/2003 | Wicker |
| 6,605,527 B1 | 8/2003 | Dennison et al. |
| 6,613,604 B1 | 9/2003 | Maimon et al. |
| 6,621,095 B1 | 9/2003 | Chiang et al. |
| 6,625,054 B1 | 9/2003 | Lowery et al. |
| 6,642,102 B1 | 11/2003 | Xu |

| | | |
|---|---|---|
| 6,646,297 B1 | 11/2003 | Dennison |
| 6,649,928 B1 | 11/2003 | Dennison |
| 6,667,900 B1 | 12/2003 | Lowery et al. |
| 6,671,710 B1 | 12/2003 | Ovshinsky et al. |
| 6,673,648 B1 | 1/2004 | Lowery |
| 6,673,700 B1 | 1/2004 | Dennison et al. |
| 6,674,115 B1 | 1/2004 | Hudgens et al. |
| 6,687,153 B1 | 2/2004 | Lowery |
| 6,687,427 B1 | 2/2004 | Ramalingam et al. |
| 6,690,026 B1 | 2/2004 | Peterson |
| 6,696,355 B1 | 2/2004 | Dennison |
| 6,707,712 B1 | 3/2004 | Lowery |
| 6,714,954 B1 | 3/2004 | Ovshinsky et al. |
| 6,737,312 B1 * | 5/2004 | Moore .................... 438/238 |
| 6,818,481 B1 * | 11/2004 | Moore et al. ............... 438/130 |
| 6,847,535 B1 * | 1/2005 | Gilton et al. ................ 365/51 |
| 6,849,868 B1 * | 2/2005 | Campbell .................... 257/35 |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0132417 A1 | 9/2002 | Li |
| 2002/0160551 A1 | 10/2002 | Harshfield |
| 2002/0163828 A1 | 11/2002 | Krieger et al. |
| 2002/0168820 A1 | 11/2002 | Kozicki |
| 2002/0168852 A1 | 11/2002 | Kozicki |
| 2002/0190289 A1 | 12/2002 | Harshfield et al. |
| 2002/0190350 A1 | 12/2002 | Kozicki et al. |
| 2003/0001229 A1 | 1/2003 | Moore et al. |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li et al. |
| 2003/0068862 A1 | 4/2003 | Li et al. |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155589 A1 | 8/2003 | Campbell et al. |
| 2003/0155606 A1 | 8/2003 | Campbell et al. |
| 2003/0156447 A1 | 8/2003 | Kozicki |
| 2003/0156463 A1 | 8/2003 | Casper et al. |
| 2003/0209728 A1 | 11/2003 | Kozicki et al. |
| 2003/0209971 A1 | 11/2003 | Kozicki et al. |
| 2003/0210564 A1 | 11/2003 | Kozicki et al. |
| 2003/0212724 A1 | 11/2003 | Ovshinsky et al. |
| 2003/0212725 A1 | 11/2003 | Ovshinsky et al. |
| 2004/035401 A1 | 2/2004 | Ramachandran et al. |

FOREIGN PATENT DOCUMENTS

| | | |
|---|---|---|
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Adler, D.; Moss, S.C., Amorphous memories and bistable switches, J. Vac. Sci. Technol. 9 (1972) 1182-1189.

Adler, D.; Henisch, H.K.; Mott, S.N., The mechanism of threshold switching in amorphous alloys, Rev. Mod. Phys. 50 (1978) 209-220.

Afifi, M.A.; Labib, H.H.; El-Fazary, M.H.; Fadel, M., Electrical and thermal properties of chalcogenide glass system $Se75Ge25-xSbx$, Appl. Phys. A 55 (1992) 167-169.

Afifi, M.A.; Labib, H.H.; Fouad, S.S.; El-Shazly, A.A., Electrical & thermal conductivity of the amorphous semiconductor $GexSe1-x$, Egypt, J. Phys. 17 (1986) 335-342.

Alekperova, Sh.M.; Gadzhieva, G.S., Current-Voltage characteristics of $Ag2Se$ single crystal near the phase transition, Inorganic Materials 23 (1987) 137-139.

Aleksiejunas, A.,; Cesnys, A., Switching phenomenon and memory effect in thin-film heterojunction of polycrystalline selenium-silver selenide, Phys. Stat. Sol. (a) 19 (1973) K169-K171.

Angell, C.A., Mobile ions in amorphous solids, Annu. Rev. Phys. Chem. 43 (1992) 693-717.

Aniya, M., Average electronegativity, medium-range-order, and ionic conductivity in superionic glasses, Solid state Ionics 136-137 (2000) 1085-1089.

Asahara, Y.; Izumitani, T., Voltage controlled switching in Cu-As-Se compositions, J. Non-Cryst. Solids 11 (1972) 97-104.

Asokan, S.; Prasad, M.V.N.; Parthasarathy, G.; Gopal, E.S.R., Mechanical and chemical thresholds in IV-VI chalcogenide glasses, Phys. Rev. Lett. 62 (1989) 808-810.

Axon Technologies Corporation, Technology Description: *Programmable Metalization Cell(PMC)*, pp. 1-6 (Pre-May 2000).

Baranovskii, S.D.; Cordes, H., On the conduction mechanism in ionic glasses, J. Chem. Phys. 111 (1999) 7546-7557.

Belin, R.: Taillades, G.; Pradel, A.; Ribes, M., Ion dynamics in superionic chalcogenide glasses: complete conductivity spectra, Solid state Ionics 136-137 (2000) 1025-1029.

Belin, R.; Zerouale, A.; Pradel, A.; Ribes, M., Ion dynamics in the argyrodite compound $Ag7GeSe5I$: non-Arrhenius behavior and complete conductivity spectra, Solid State Ionics 143 (2001) 445-455.

Benmore, C.J.; Salmon, P.S., Structure of fast ion conducting and semiconducting glassy chalcogenide alloys, Phys. Rev. Lett. 73 (1994) 264-267.

Bernede, J.C., Influence du metal des electrodes sur les caracteristiques courant-tension des structures M-Ag2Se-M, Thin solid films 70 (1980) L1-L4.

Bernede, J.C., Polarized memory switching in MIS thin films, Thin Solid Films 81 (1981) 155-160.

Bernede, J.C., Switching and silver movements in $Ag2Se$ thin films, Phys. Stat. Sol. (a) 57 (1980) K101-K104.

Bernede, J.C.; Abachi, T., Differential negative resistance in metal/insulator/metal structures with an upper bilayer electrode, Thin solid films 131 (1985) L61-L64.

Bernede, J.C.; Conan, A.; Fousenan't, E.; El Bouchairi, B.; Goureaux, G., Polarized memory switching effects in $Ag2Se/Se/M$ thin film sandwiches, Thin solid films 97 (1982) 165-171.

Bernede, J.C.; Khelil, A.; Kettaf, M.; Conan, A., Transition from S- to N-type differential negative resistance in $Al-Al2O3-Ag2-xSe1+x$ thin film structures, Phys. Stat. Sol. (a) 74 (1982) 217-224.

Bondarev, V.N.; Pikhista, P.V., A dendrite model of current instability in $RbAg4I5$, Solid State Ionics 70/71 (1994) 72-76.

Boolchand, P., The maximum in glass transition temperature (Tg) near $x=1/3$ in $GexSe1-x$ Glasses, Asian Journal of Physics (2000) 9, 709-72.

Boolchand, P.; Bresser, W.J., Mobile silver ions and glass formation in solid electrolytes, Nature 410 (2001) 1070-1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural ordering of evaporated amorphous chalcogenide alloy films: role of thermal annealing, Diffusion and Defect Data vol. 53-54 (1987) 415-420.

Boolchand, P.; Grothaus, J.; Bresser, W.J.; Suranyi, P., Structural origin of broken chemical order in a GeSe2 glass, Phys. Rev. B 25 (1982) 2975-2978.

Boolchand, P.; Grothaus, J.; Phillips, J.C., Broken chemical order and phase separation in GexSe1-x glasses, Solid state comm. 45.(1983) 183-185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 glasses compared, Proc. Int. Conf. Phys. Semicond. (Eds. Chadi and Harrison) 17th (1985) 833-36.

Bresser, W.; Boolchand, P.; Suranyi, P., Rigidity percolation and molecular clustering in network glasses, Phys. Rev. Lett. 56 (1986) 2493-2496.

Bresser, W.J.; Boolchand, P.; Suranyi, P.; de Neufville, J.P, Intrinsically broken chalcogen chemical order in stoichiometric glasses, Journal de Physique 42 (1981) C4-193-C4-196.

Bresser, W.J.; Boolchand, P.; Suranyi, P.; Hernandez, J.G., Molecular phase separation and cluster size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-Temperature, electric field induced creation of stable devices in CuInSe2 Crystals, Science 258 (1992) 271-274.

Chatterjee, R.; Asokan, S.; Titus, S.S.K., Current-controlled negative-resistance behavior and memory switching in bulk As-Te-Se glasses, J. Phys. D: Appl. Phys. 27 (1994) 2624-2627.

Chen, C.H.; Tai, K.L. , Whisker growth induced by Ag photodoping in glassy GexSe1-x films, Appl. Phys. Lett. 37 (1980) 1075-1077.

Chen, G.; Cheng, J., Role of nitrogen in the crystallization of silicon nitride-doped chalcogenide glasses, J. Am. Ceram. Soc. 82 (1999) 2934-2936.

Cehn, G.; Cheng, J.; Chen, W., Effect of Si3N4 on chemical durability of chalcogenide glass, J. Non-Cryst. Solids 220 (1997) 249-253.

Cohen, M.H.; Neale, R.G.; Paskin, A., A model for an amorphous semiconductor memory device, J. Non-Cryst. Solids 8-10 (1972) 885-891.

Croitoru, N.; Lazarescu, M.; Popescu, C.; Telnic, M.; and Vescan, L., Ohmic and non-ohmic conduction in some amorphous semiconductors, J. Non-Cryst. Solids 8-10 (1972) 781-786.

Dalven, R.; Gill, R., Electrical properties of beta-Ag2Te and beta-Ag2Se from 4.2 to 300K, J. Appl. Phys. 38 (1967) 753-756.

Davis, E.A., Semiconductors without form, Search 1 (1970) 152-155.

Deamaley, G.; Stoneham, A.M.; Morgan, D.V., Electrical phenomena in amorphous oxide films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold switching in hydrogenated amorphous silicon, Appl. Phys. Lett. 40 (1982) 812-813.

Drusedau, T.P.; Panckow, A.N.; Klabunde, F., The hydrogenated amorphous silicon/nanodisperse metal (SIMAL) system-Films of unique electronic properties, J. Non-Cryst. Solids 198-200 (1996) 829-832.

El Bouchairi, B.; Bernede, J.C.; Burgaud, P., Properties of Ag2-xSe1+x/n-Si diodes, Thin Solid Films 110 (1983) 107-113.

El Gharras, Z.; Bourahla, A.; Vautier, C., Role of photoinduced defects in amorphous GexSe1-x photoconductivity, J. Non-Cryst. Solids 155 (1993) 171-179.

El Ghrandi, R.; Calas, J.; Galibert, G.; Averous, M., Silver photodissolution in amorphous chalcogenide thin films, Thin Solid Films 218 (1992)259-273

El Ghrandi, R.; Calas, J.; Galibert, G., Ag dissolution kinetics in amorphous GeSe5.5 thin films from "in-situ" resistance measurements vs time, Phys. Stat. Sol. (a) 123 (1991) 451-460.

El-kady, Y.L., The threshold switching in semicondcuting glass Ge21Se17Te62, Indian J. Phys. 70A (1996) 507-516.

Elliott, S.R., A unified mechanism for metal photodissolution in amorphous chalcogenide materials, J. Non-Cryst. Solids 130 (1991) 85-97.

Elliott, S.R., Photodissolution of metals in chalcogenide glasses: A unified mechanism, J. Non-Cryst. Solids 137-138 (1991) 1031-1034.

Elsamanoudy, M.M.; Hegab, N.A.; Fadel, M., Conduction mechanism in the pre-switching state of thin films containing Te As Ge Si, Vacuum 46 (1995) 701-707.

El-Zahed, H.; El-Korashy, A., Influence of composition on the electrical and optical properties of Ge20BixSe80-x films, Thin Solid Films 376 (2000) 236-240.

Fadel, M., Switching phenomenon in evaporated Se-Ge-As thin films of amorphous chalcogenide glass, Vacuum 44 (1993) 851-855.

Fadel, M..; El-Shair, H.T., Electrical, thermal and optical properties of Se75Ge7Sb18, Vacuum 43 (1992) 253-257.

Feng, X. ;Bresser, W.J.; Boolchand, P., Direct evidence for stiffness threshold in Chalcogenide glasses, Phys. Rev. Lett. 78 (1997) 4422-4425.

Feng, X.; Bresser, W.J.; Zhang, M.; Goodman, B.; Boolchand, P., Role of network connectivity on the elastic, plastic and thermal behavior of covalent glasses, J. Non-Cryst. Solids 222 (1997) 137-143.

Fischer-Colbrie, A.; Bienenstock, A.; Fuoss, P.H.; Marcus, M.A., Structure and bonding in photodiffused amorphous Ag-GeSe2 thin films, Phys. Rev. B 38 (1988) 12388-12403.

Fleury, G.; Hamou, A.; Viger, C.; Vautier, C., Conductivity and crystallization of amorphous selenium, Phys. Stat. Sol. (a) 64 (1981) 311-316.

Fritzsche, H, Optical and electrical energy gaps in amorphous semiconductors, J. Non-Cryst. Solids 6 (1971) 49-71.

Fritzsche, H., Electronic phenomena in amorphous semiconductors, Annual Review of Materials Science 2 (1972) 697-744.

Gates, B.; Wu, Y.; Yin, Y.; Yang, P.; Xia, Y., Single-crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation creep of Ge-Se chalcogenide glasses below Tg: elastic recovery and non-Newtonian flow, J. Non-Cryst. Solids 298 (2002) 260-269.

Guin, J.-P.; Rouxel, T.; Sangleboeuf, J.-C.; Melscoet, I.; Lucas, J., Hardness, toughness, and scratchability of germanium-selenium chalcogenide glasses, J. Am. Ceram. Soc. 85 (2002) 1545-52.

Gupta, Y. P., On electrical switching and memory effects in amorphous chaclogenides, J. Non-Cryst. Sol. 3 (1970) 148-154.

Haberland, D.R.; Steigler, H., New experiements on the charge-controlled switching effect in amorphous semiconductors, John Non-Cryst. Solids 8-10 (1972) 408-414.

Haifz, M.M.; Ibrahim, M.M.; Dongol, M.; Hammad, F.H., Effect of composition on the structure and electrical properties of As-Se-Cu glasses, J. Apply. Phys. 54 (1983) 1950-1954.

Hajto, J.; Rose, M.J.; Osborne, I.S.; Snell, A.J.; Le Comber, P.G.; Owen, A.E., Quantization effects in metal/a-Si:H/metal devices, Int. J. Electronics 73 (1992) 911-913.

Hajto, J.; Hu, J.; Snell, A.J.; Turvey, K.; Rose, M., DC and AC measurements on metal/a-Si:H/metal room temperature quantised resistance devices, J. Non-Cryst. Solids 266-269 (2000) 1058-1061.

Hajto, J.; McAuley, B.; Snell, A.J.; Owen, A.E., Theory of room temperature quantized resistance effects in metal-a-Si:H-metal thin film structures, J. Non-Cryst. Solids 198-200 (1996) 825-828.

Hajto, J.; Owen, A.E.; Snell, A.J.; Le Comber, P.G.; Rose, M.J., Analogue memory and ballistic electron effects in metal-amorphous silicon structures, Phil. Mag. B 63 (1991) 349-369.

Hayashi, T.; Ono, Y.; Fukaya, M.; Kan, H., Polarized memory switching in amorphous Se film, Japan. J. Appl. Phys. 13 (1974) 1163-1164.

Hegab, N.A.; Fadel, M.; Sedeek, K., Memory switching phenomena in thin films of chalcogenide semiconductors, Vacuum 45 (1994) 459-462.

Helbert et al., *Intralevel hybrid resist process with submicron capability*, SPIE vol. 333 Submicron Lithography, pp. 24-29 (1982).

Hilt, Dissertation: *Materials characterization of Silver Chalcogenide Programmable Metalization Cells*, Arizona State University, pp. Title page-114 (UMI Company, May 1999).

Hirose et al., *High Speed Memory Behavior and Reliability of an Amorphous $As_2S_3$ Film Doped Ag*, Phys. Stat. Sol. (a) 61, pp. 87-90 (1980).

Hirose, Y.; Hirose, H., Polarity-dependent memory switching and behavior of Ag dendrite in Ag-photodoped amorphous As2S3 films, J. Appl. Phys. 47 (1976) 2767-2772.

Holmquist et al., *Reaction and Diffusion in Silver-Arsenic Chalcogenide Glass Systems*, 62 J. Amer. Ceram. Soc., No. 3-4, pp. 183-188 (Mar.-Apr. 1979).

Hong, K.S.; Speyer, R.F., Switching behavior in II-IV-V2 amorphous semiconductor systems, J. Non-Cryst. Solids 116 (1990) 191-200.

Hosokawa, S., Atomic and electronic structures of glassy GexSe1-x around the stiffness threshold composition, J. Optoelectronics and Advanced Materials 3 (2001) 199-214.

Hu, J.; Snell, A.J.; Hajto, J.; Owen, A.E., Constant current forming in Cr/p+a-/Si:H/V thin film devices, J. Non-Cryst. Solids 227-230 (1998) 1187-1191.

Hu, J.; Hajto, J.; Snell, A.J.; Owen, A.E.; Rose, M.J., Capacitance anomaly near the metal-non-metal transition in Cr-hydrogenated amorphous Si-V thin-film devices, Phil. Mag. B. 74 (1996) 37-50.

Hu, J.; Snell, A.J.; Hajto, J.; Owen, A.E., Current-induced instability in Cr-p+a-Si:H-V thin film devices, Phil. Mag. B 80 (2000) 29-43.

Huggett et al., Development of silver sensitized germanium slenide photoresist by reactive sputter etching in SF6, 42 Appl. Phys. Lett., No. 7, pp. 592-594 (Apr. 1983).

Iizima, S.; Sugi, M.; Kikuchi, M.; Tanaka, K., Electrical and thermal properties of semiconducting glasses As-Te-Ge, Solid State Comm. 8 (1970) 153-155.

Ishikawa, R.; Kikuchi, M., Photovoltaic study on the photo-enhanced diffusion of Ag in amorphous films of Ge2S3, J. Non-Cryst. Solids 35 & 36 (1980) 1061-1066.

Iyetomi, H.; Vashishta, P.; Kalia, R.K., Incipient phase separation in Ag/Ge/Se glasses: clustering of Ag atoms, J. Non-Cryst. Solids 262 (2000) 135-142.

Jones, G.; Collins, R.A., Switching properties of thin selenium films under pulsed bias, Thin Solid Films 40 (1977) L15-L18.

Joullie, A.M.; Marucchi, J., On the DC electrical conduction of amorphous As2Se7 before switching, Phys. Stat. Sol. (a) 13 (1972) K105-K109.

Joullie, A.M.; Marucchi, J., Electrical properties of the amorphous alloy As2Se5, Mat. Res. Bull. 8 (1973) 433-442.

Kaplan, T.; Adler, D., Electrothermal switching in amorphous semiconductors, J. Non-Cryst. Solids 8-10 (1972) 538-543.

Kawaguchi et al., *Mechanism of photosurface deposition*, 164-166 J. Non-Cryst. Solids, pp. 1231-1234 (1993).

Kawaguchi, T.; Maruno, S.; Elliott, S.R., Optical, electrical, and structural properties of amorphous Ag-Ge-S and Ag-Ge-Se films and comparison of photoinduced and thermally induced phenomena of both systems, J. Appl. Phys. 79 (1996) 9096-9104.

Kawaguchi, T.; Masui, K., Analysis of change in optical transmission spectra resulting from Ag photodoping in chalcogenide film, Japn. J. Appl. Phys. 26 (1987) 15-21.

Kawamoto, Y., Nishida, M., Ionic Condition in As2S3—Ag2S, GeS2—GeS—Ag2S and P2S5—Ag2S Glasses, J. Non-Cryst Solids 20(1976) 393-404.

Kawasaki, M.; Kawamura, J.; Nakamura, Y.; Aniya, M., Ionic conductivity of Agx(GeSe3)1-x (0<=x<=0.571) glasses, Solid state Ionics 123 (1999) 259-269.

Kluge, G.; Thomas, A.; Klabes, R.; Grotzschel, R., Silver photodiffusion in amorphous GexSe100-x, J. Non-Cryst. Solids 124 (1990) 186-193.

Kolobov, A.V., On the origin of p-type conductivity in amorphous chalcogenides, J. Non-Cryst. Solids 198-200 (1996) 728-731.

Kolobov, A.V., Lateral diffusion of silver in vitreous chalcogenide films, J. Non-Cryst. Solids 137-138 (1991) 1027-1030.

Kolobov et al., Photodoping of amorphous chalcogenides by metals, Advances in Physics, 1991, vol. 40, No. 5, pp. 625-684.

Korkinova, Ts.N; Andreichin,R.E., Chalcogenide glass polarization and the type of contacts, J. Non-Cryst. Solids 194 (1996) 256-259.

Kotkata, M.F.; Afif, M.A.; Labib, H.H.; Hegab, N.A.; Abdel-Aziz, M.M., Memory switching in amorphous GeSeTI chalcogenide semiconductor films, Thin Solid Films 240 (1994) 143-146.

Kozicki et al., Silver incorporation in thin films of selenium rich Ge-Se glasses, International Congress on Glass, vol. 2, Extended Abstracts, Jul. 2001, pp. 8-9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes In Metal-Doped Chalcogenides, Electrochemical Society Proceedings, vol. 99-13, 1999, pp. 298-309.

Kozicki et al., Nanoscale effects in devices based on chalcogenide solid solutions, Superlattices and Microstructures, vol. 27, No. 516, 2000, pp. 485-488.

Kozicki et al., Nanoscale phase separation in Ag-Ge-Se glasses, Microelectronic Engineering 63 (2002) pp. 155-159.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16-19.

Lal, M.; Goyal, N., Chemical bond approach to study the memory and threshold switching chalcogenide glasses, Indian Journal of pure & appl. phys. 29 (1991) 303-304.

Leimer, F.; Stotzel, H.; Kottwitz, A., Isothermal electrical polarisation of amorphous GeSe films with blocking Al contacts influenced by Poole-Frenkel conduction, Phys. Stat. Sol. (a) 29 (1975) K129-K132.

Leung, W.; Cheung, N.; Neureuther, A.R., Photoinduced diffusion of Ag in GexSe1-x glass, Appl. Phys. Lett. 46 (1985) 543-545.

Matsushita, T.; Yamagami, T.; Okuda, M., Polarized memory effect observed on Se-SnO2 system, Jap. J. Appl. Phys. 11 (1972) 1657-1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L., Reversible and irreversible electrical switching in TeO2—V2O5 based glasses, Journal de Physique IV 2 (1992) C2-185-C2-188.

McHardy et al., The dissolution of metals in amorphous chalcogenides and the effects o electron and ultraviolet radiation, 20 J. Phys., C.: Solid State Phys., pp. 4055-4075 (1987)f.

Messoussi, R.; Bernede, J.C.; Benhida, S.; Abachi, T.; Latef, A., Electrical characterization of M/Se structures (M=Ni,Bi), Mat. Chem. And Phys. 28 (1991) 253-258.

Mitkova, M.; Boolchand, P., Microscopic origin of the glass forming tendency in chalcogenides and constraint theory, J. Non-Cryst. Solids 240 (1998) 1-21.

Mitkova, M.; Kozicki, M.N., Silver incorporation in Ge-Se glasses used in programmable metallization cell devices, J. Non-Cryst. Solids 299-302 (2002) 1023-1027.

Mitkova, M.; Wang, Y.; Boolchand, P., Dual chemical role of Ag as an additive in chalcogenide glasses, Phys. Rev. Lett. 83 (1999) 3848-3851.

Miyatani, S.-y., Electronic and ionic conduction in (AgxCu1-x)2Se, J. Phys. Soc. Japan 34 (1973) 423-432.

Miyatani, S.-y., Electrical properties of Ag2Se, J. Phys. Soc. Japan 13 (1958) 317.

Miyatani, S.-y., Ionic conduction in beta-Ag2Te and beta-Ag2Se, Journal Phys. Soc. Japan 14 (1959) 996-1002.

Mott, N.F., Conduction in glasses containing transition metal ions, J. Non-Cryst. Solids 1 (1968) 1-17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564-569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157-6161.

Nang, T.T.; Okuda, M.; Matsushita, T.; Yokota, S.; Suzuki, A., Electrical and optical parameters of GexSe1-x amorphous thin films, Jap. J. App. Phys. 15 (1976) 849-853.

Narayanan, R.A.; Asokan, S.; Kumar, A., Evidence concerning the effect of topology on electrical switching in chalcogenide network glasses, Phys. Rev. B 54 (1996) 4413-4415.

Neale, R.G.; Aseltine, J.A., The application of amorphous materials to computer memories, IEEE transactions on electron dev. Ed-20 (1973) 195-209

Ovshinsky S.R.; Fritzsche, H., Reversible structural transformations in amorphous semiconductors for memory and logic, Mettalurgical transactions 2 (1971) 641-645.

Ovshinsky, S.R., Reversible electrical switching phenomena in disordered structures, Phys. Rev. Lett. 21 (1968) 1450-1453.

Owen, A.E.; LeComber, P.G.; Sarrabayrouse, G.; Spear, W.E., New amorphous-silicon electrically programmable nonvolatile switching device, IEE Proc. 129 (1982) 51-54.

Owen, A.E.; Firth, A.P.; Ewen, P.J.S., Photo-induced structural and physico-chemical changes in amorphous chalcogenide semiconductors, Phil. Mag. B 52 (1985) 347-362.

Owen, A.E.; Le Comber, P.G.; Hajto, J.; Rose, M.J.; Snell, A.J., Switching in amorphous devices, Int. J. Electronics 73 (1992) 897-906.

Owen et al., Metal-Chalcogenide Photoresists for High Resolution Lithography and Sub-Micron Structures, Nanostructure Physics and Fabrication, pp. 447-451 (M. Reed ed. 1989).

Pearson, A.D.; Miller, C.E., Filamentary conduction in semiconducting glass diodes, App. Phys. Lett. 14 (1969) 280-282.

Pinto, R.; Ramanathan, K.V., Electric field induced memory switching in thin films of the chalcogenide system Ge-As-Se, Appl. Phys. Lett. 19 (1971) 221-223.

Popescu, C., The effect of local non-uniformities on thermal switching and high field behavior of structures with chalcogenide glasses, Solid-state electronics 18 (1975) 671-681.

Popescu, C.; Croitoru, N., The contribution of the lateral thermal instability to the switching phenomenon, J. Non-Cryst. Solids 8-10 (1972) 531-537.

Popov, A.I.; Geller, I.KH.; Shemetova, V.K., Memory and threshold switching effects in amorphous selenium, Phys. Stat. Sol. (a) 44 (1977) K71-K73.

Prakash, S.; Asokan, S.; Ghare, D.B., Easily reversible memory switching in Ge-As-Te glasses, J. Phys. D; Appl. Phys. 29 (1996) 2004-2008.

Rahman, S.; Sivarama Sastry, G., Electronic switching in Ge-Bi-Se-Te glasses, Mat. Sci. and Eng. B12 (1992) 219-222.

Ramesh, K.; Asokan, S.; Sangunni, K.S.; Gopal, E.S.R., Electrical Switching in germanium telluride glasses doped with Cu and Ag, Appl. Phys. A 69 (1999) 421-425.

Rose,M.J.;Hajto,J.;Lecomber,P.G.;Gage,S.M.;Choi,W.K.;Snell,A.J.;Owen,A.E., Amorphous silicon analogue memory devices, J. Non-Cryst. Solids 115 (1989) 168-170.

Rose,M.J.;Snell,A.J.;Lecomber,P.G.;Hajto,J.;Fitzgerald,A.G.;Owen,A.E., Aspects of non-volatility in a -Si:H memory devices, Mat. Res. Soc. Symp. Proc. V 258, 1992, 1075-1080.

Schuocker, D.; Rieder, G., On the reliability of amorphous chalcogenide switching devices, J. Non-Cryst. Solids 29 (1978) 397-407.

Sharma, A.K.; Singh, B., Electrical conductivity measurements of evaporated selenium films in vacuum, Proc. Indian Natn. Sci. Acad. 46, A, (1980) 362-368.

Sharma, P., Structural, electrical and optical properties of silver selenide films, Ind. J. Of pure and applied phys. 35 (1997) 424-427.

Shimizu et al., *The Photo-Erasable Memory Switching Effect of Ag Photo-Doped Chalcogenide Glasses*, 46 B. Chem Soc. Japan, No. 12, pp. 3662-3365 (1973).

Snell, A.J.; Lecomber, P.G.; Hajto, J.; Rose, M.J.; Owen, A.E.; Osborne, I.L., Analogue memory effects in metal/a-Si:H/metal memory devices, J. Non-Cryst. Solids 137-138 (1991) 1257-1262.

Snell, A.J.; Hajto, J.;Rose, M.J.; Osborne, L.S.; Holmes, A.; Owen, A.E.; Gibson, R.A.G., Analogue memory effects in metal/a-Si:H/metal thin film structures, Mat. Res. Soc. Symp. Proc. V 297, 1993, 1017-1021.

Steventon, A.G., Microfilaments in amorphous chalcogenide memory devices, J. Phys. D: Appl. Phys. 8 (1975) L120-L122.

Steventon, A.G., The switching mechanisms in amorphous chalcogenide memory devices, J. Non-Cryst. Solids 21 (1976) 319-329.

Stocker, H.J., Bulk and thin film switching and memory effects in semiconducting chalcogenideglasses, App. Phys. Lett. 15 (1969) 55-57.

Tanaka, K., Ionic and mixed conductions in Ag photodoping process, Mod. Phys. Lett B 4 (1990) 1373-1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387-389.

Thornburg, D.D., Memory switching in a Type I amorphous chalcogenide, J. Elect. Mat. 2 (1973) 3-15.

Thornburg, D.D., Memory switching in amorphous arsenic triselenide, J. Non-Cryst. Solids 11 (1972) 113-120.

Thornburg, D.D.; White, R.M., Electric field enhanced phase separation and memory switching in amorphous arsenic triselenide, Journal(??) (1972) 4609-4612.

Tichy, L.; Ticha, H., Remark on the glass-forming ability in GexSe1-x and AsxSe1-x systems, J. Non-Cryst. Solids 261 (2000) 277-281.

Titus, S.S.K.; Chatterjee, R.; Asokan, S., Electrical switching and short-range order in As-Te glasses, Phys. Rev. B 48 (1993) 14650-14652.

Tranchant,S.;Peytavin,S.;Ribes,M.;Flank,A.M.;Dexpert,H.;Lagarde,J.P., SIlver chalcogenide glasses Ag-Ge-Se: Ionic conduction and exafs strucural investigation, Transport-structure relations in fast ion and mixed conductors Proceedings of the 6th Riso International symposium. Sep. 9-13, 1985.

Tregouet, Y.; Bernede, J.C., Silver movements in Ag2Te thin films: switching and memory effects, Thin Solid Films 57 (1979) 49-54.

Uemura, O.; Kameda, Y.; Kokai, S.; Satow, T., Thermally induced crystallization of amorphous Ge0.4Se0.6, J. Non-Cryst. Solids 117-118 (1990) 219-221.

Uttecht, R.; Stevenson, H.; Sie, C.H.; Griener J,D.;Raghaven, K.S. Electric field induced filament formation As-Te-Ge glass, J. Non-Cryst. Solids 2 (1970) 358-370.

Viger, C.; Lefrancois, G.; Fleury, G., Anomalous behaviour of amorphous selenium films, J. Non-Cryst. Solids 33 (1976) 267-272.

Vodenicharov, C.; Parvanov,S.; Petkov,P., Electrode-limited currents in the thin-film M-GeSe-M system, Mat. Chem. And Phys. 21 (1989) 447-454.

Wang, S.-J.; Misium, G.R.; Camp, J.C.; Chen, K.-L.; Tigelaar, H.L., High-performance Metal-silicide antifuse, IEEE electron dev. Lett. 13 (1992)471-472.

Weirauch, D.F., Threshold switching and thermal filaments in amorphous semiconductors, App. Phys. lett. 16 (1970) 72-73.

West, W.C.; Sieradzki, K.; Kardynal, B.; Kozicki, M.N., Equivalent circuit modeling of the AglAs0.24S0.36.Ag0.40lAg System prepared by photodissolution of Ag, J. Electrochem. Soc. 145 (1998) 2971-2974.

West, W.C., Electrically erasable non-volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope $\Box dTg/d<m>$ at the rigidity percolation threshold (<m>=2.4), J. Non-Cryst. Solids 151 (1992) 159-154.

* cited by examiner

THIN FILM DIODE INTEGRATED WITH CHALCOGENIDE MEMORY CELL

The present application is a divisional application of U.S. patent application Ser. No. 10/121,794, filed on Apr. 10, 2002 now U.S. Pat. No. 6,855,975, the disclosure of which is incorporated herein by reference in its entirety.

FIELD OF THE INVENTION

This invention relates generally to a method of manufacture for memory devices in integrated circuits and more particularly to programmable conductor memory arrays comprising glass electrolyte elements.

BACKGROUND OF THE INVENTION

The digital memory most commonly used in computers and computer system components is the dynamic random access memory (DRAM), wherein voltage stored in capacitors represents digital bits of information. Electric power must be supplied to the capacitors to maintain the information because, without frequent refresh cycles, the stored charge dissipates, and the information is lost. Memories that require constant power are known as volatile memories.

Non-volatile memories do not need frequent refresh cycles to preserve their stored information, so they consume less power than volatile memories and can operate in an environment where the power is not always on. There are many applications where non-volatile memories are preferred or required, such as in cell phones or in control systems of automobiles. Non-volatile memories include magnetic random access memories (MRAMs), erasable programmable read only memories (EPROMs) and variations thereof.

Another type of non-volatile memory is the programmable conductor or programmable metallization memory cell, which is described by Kozicki et al. in (U.S. Pat. No. 5,761,115; No. 5,914,893; and No. 6,084,796) and is included by reference herein. The programmable conductor cell of Kozicki et al. (also referred to by Kozicki et al. as a "metal dendrite memory") comprises a glass ion conductor, such as a chalcogenide-metal ion glass and a plurality of electrodes disposed at the surface of the fast ion conductor and spaced a distance apart from one another. The glass/ion element shall be referred to herein as a "glass electrolyte," or, more generally, "cell body."

When a voltage is applied to the anode and the cathode, a non-volatile conductive pathway (considered a sidewall "dendrite" by Kozicki et al.) grows from the cathode through or along the cell body towards the anode, shorting the electrodes and allowing current flow. The dendrite stops growing when the voltage is removed. The dendrite shrinks, re-dissolving metal ions into the cell body, when the voltage polarity is reversed. In a binary mode, the programmable conductor cell has two states; a fully-grown dendrite or shorted state that can be read as a 1, and a state wherein the dendrite does not short out the electrodes that can be read as a 0, or vice versa. It is also possible to arrange variable resistance or capacitance devices with multiple states.

The recent trends in memory arrays generally have been to form first a via, then fill it with a memory storage element (e.g., capacitor) and etch back. It is simple to isolate individual memory cells in this way. Programmable memory cells also have been fabricated using this so-called container configuration, wherein the electrodes and cell body layers are deposited into a via that has been etched into an insulating layer. Metal diffusion in the course of growing and shrinking the conductive pathway is confined by the via wall. The memory cell can be formed in a number of array designs. For example, in a cross-point circuit design, memory elements are formed between upper and lower conductive lines at intersections. When forming a programmable conductor array with the glass electrolyte elements similar to those of Kozicki et al., vias are formed in an insulating layer and filled with the memory cell bodies, such as metal-doped glass electrolyte or glass fast ion diffusion (GFID) elements.

Accordingly, a need exists for improved methods and structures for forming integrated programmable conductor memory arrays.

SUMMARY OF THE INVENTION

An integrated programmable conductor memory cell and diode device in an integrated circuit is provided. The device comprises at least a first diode element, a glass electrolyte element over the first diode element, and a top electrode in contact with the glass electrolyte element. The glass electrolyte element has metal ions mixed or dissolved therein and is able to selectively form a conductive pathway under the influence of an applied voltage.

In accordance with one aspect of the present invention, a memory device, comprising an integrated diode and programmable conductor memory cell is provided wherein both the diode and the memory cell comprise a chalcogenide glass.

In one embodiment, an integrated programmable conductor memory cell and diode device is provided. The device comprises a first polysilicon layer with a first conductivity type doping, a layer of germanium selenide glass containing metal ions over the first polysilicon layer and a top electrode over the layer of germaniumselenide glass. The device can further comprise a silicon substrate region having a second conductivity type doping, opposite to the first conductivity type doping, wherein the silicon substrate region is in direct contact with the first polysilicon layer.

In accordance with another aspect of the invention, a method of fabricating a PCRAM (programmable conductor random access memory) is provided. The method comprises forming an insulating layer with an array of vias, providing at least one diode element in each via and providing a chalcogenide glass memory element over the diode element in each via. The chalcogenide glass memory element has metal ions therein and is capable of selectively forming a conductive pathway under the influence of an applied voltage.

In yet another aspect of the invention, a method for making a PCRAM cell with an integrated thin film diode in a via is provided. The method comprises providing a diffusion barrier material at a bottom of the via, depositing a first chalcogenide glass to fill the via, etching the first chalcogenide glass back to form a recess in the via, doping the first chalcogenide glass to a predetermined depth after etching, forming a mixture of a second chalcogenide glass and a first conductive material to fill the via after doping and depositing a second conductive material over the mixture.

BRIEF DESCRIPTION OF THE DRAWINGS

These and other aspects of the invention will be readily understood by the skilled artisan in view of the detailed description of the preferred embodiments below and the appended drawings, which are meant to illustrate and not to limit the invention, and in which.

DETAILED DESCRIPTION OF THE PREFERRED EMBODIMENT

A simple diode comprises two diode elements, or sides of opposite conductivity type, in contact with each another, which form a p-n junction at their interface. More complex structures can be made from multiple diode elements.

It is desirable to have a diode connected in series with each memory cell in an array. This allows for discrete switching of the memory cell as a certain level of forward bias is needed to overcome the diode barrier. Above that voltage, current flows easily through the diode. This diode barrier prevents accidental switching of the memory element. It is further desirable that the diode be "leaky," that is, that it allow a small amount of conduction when reverse biased to allow a trickle current for reading the memory cell state.

For the purpose of this disclosure, an integrated programmable conductor memory cell and diode device is defined as a device that incorporates both a programmable conductor memory cell and a diode so that they function together, without intervening electrical devices or lines, although layers such as optional diffusion barriers (described below) can intervene. Several embodiments are discussed comprising various configurations wherein a programmable conductor memory cell and diode elements are arranged to perform this function.

The aforementioned needs are satisfied by the preferred embodiments of the present invention, which provide integrated programmable conductor memory cells and diode devices and methods for making the same. The advantages of the embodiments will become more fully apparent from the following description taken in conjunction with the accompanying drawings.

Reference will now be made to the drawings wherein like numerals refer to like parts throughout. The figures have not been drawn to scale.

A programmable conductor memory element comprises a glass electroltyte element, such as a chalcogenide glass element with metal ions mixed or dissolved therein, which is capable of forming a conductive pathway along or through the glass element under the influence of an applied voltage. The extent of the conductive pathway depends upon applied voltage and time; the higher the voltage, the faster the growth rate; and the longer the time, the greater the extent of the conductive pathway. The conductive pathway stops growing when the voltage is removed. The conductive pathway shrinks, re-dissolving metal ions into the cell body, when the voltage polarity is reversed.

Figure 1:
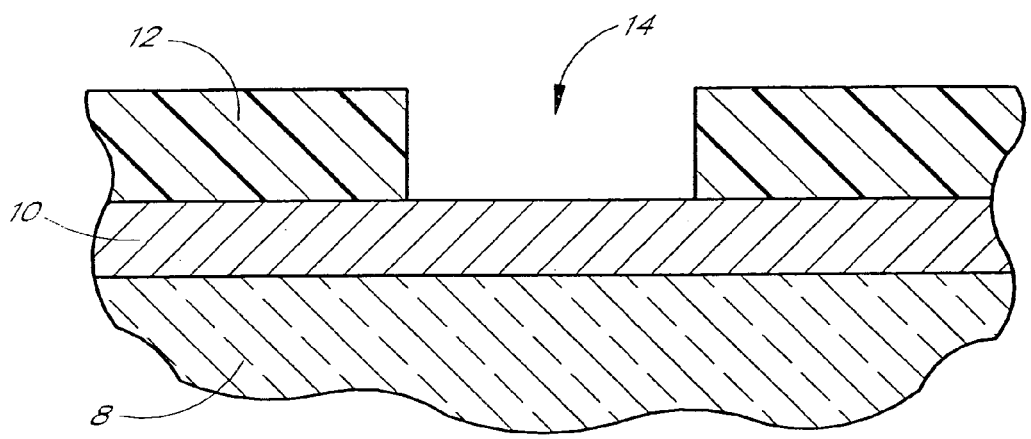
FIG. 1 is a cross section of a partially fabricated integrated circuit, showing a via in a silicon nitride layer over a bottom conducting line.

FIG. 1 is a cross-section drawing showing a structure for a portion of a memory array from which many embodiments of the current invention can be constructed. A bottom conducting line 10 overlies a substrate 8. The substrate 8 may be a simple silicon wafer or it may contain up to several layers of integrated circuit devices and insulating layers; typically, an insulating layer intervenes between the conducting line 10 of a cross-point array and a lower semiconductor layer (e.g., top portion of a silicon wafer or an epitaxial layer thereover). The bottom conducting line 10 extends from side to side in the plane of the page and continues on past the edges of the page. For the memory array, there are a series of conducting lines parallel to the one 10 shown lying over the substrate 8. The bottom conducting line 10 may comprise any conducting material suitable for integrated circuit manufacture, such as aluminum, copper, or combinations thereof. Preferably, the bottom conducting line 10 comprises tungsten and acts as a bottom electrode for devices that will be fabricated over and in contact with the line 10. In one arrangement, an additional layer (not shown) comprising a diffusion barrier, preferably tungsten or tungsten nitride, is deposited over the bottom conducting line 10.

A layer of an insulating material 12 has been deposited over the bottom conducting line 10. Preferably, the insulating layer 12 has a thickness between about 25 nm and 150 nm, more preferably between about 35 nm and 75 nm, most preferably, between about 40 nm and 60 nm. The insulating material 12 may be any insulating material that does not interact adversely with the materials used in the programmable conductor memory cell and that has enough structural integrity to support a cell formed in a via therein. Suitable materials include oxides and nitrides. Preferably, the insulating layer 12 comprises silicon nitride. Using standard techniques, an array of vias is patterned and etched into the insulating layer 12. The vias are positioned so that their bottom surfaces expose a bottom conducting line (or a diffusion barrier layer thereover). One via 14 that exposes the bottom conducting line 10 is shown in FIG. 1. The width of the via 14 is preferably between about 100 nm and 180 run, more preferably between about 120 nm and 140 nm. It is in vias such as the one shown in FIG. 1 that the programmable conductor memory cells of many preferred embodiments can be constructed.

Figure 2:
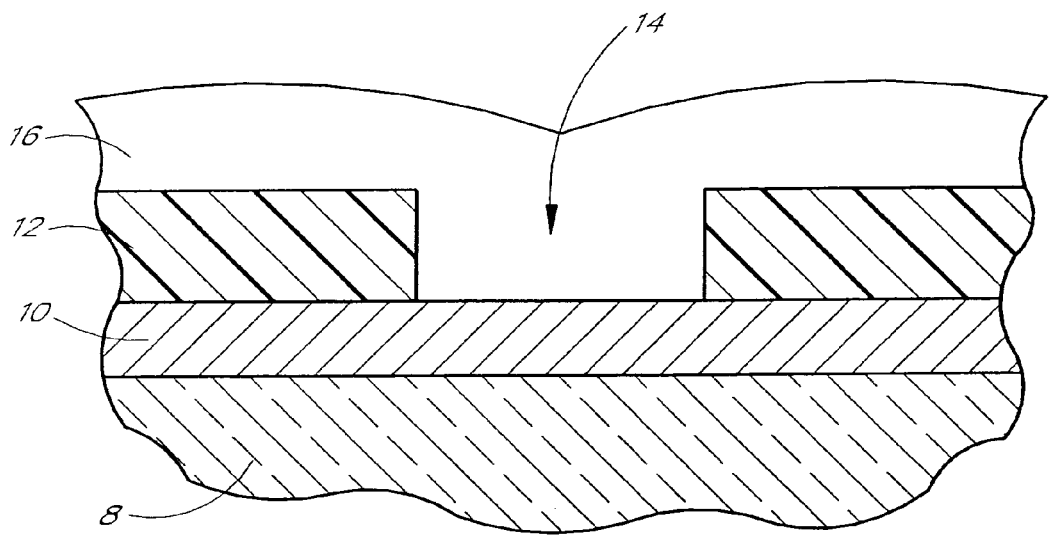
FIG. 2 shows the via of FIG. 1 after filling the via with germanium selenide (Ge—Se) glass.

FIG. 2 shows the structure of FIG. 1 after deposition of a chalcogenide glass 16, preferably a germanium selenide (Ge—Se) glass, such as $Ge_2Se_8$ or $Ge_{25}Se_{75}$, to overfill the via 14. The chalcogenide glass may be deposited by any of a number of methods including sputtering and evaporating.

Figure 3:
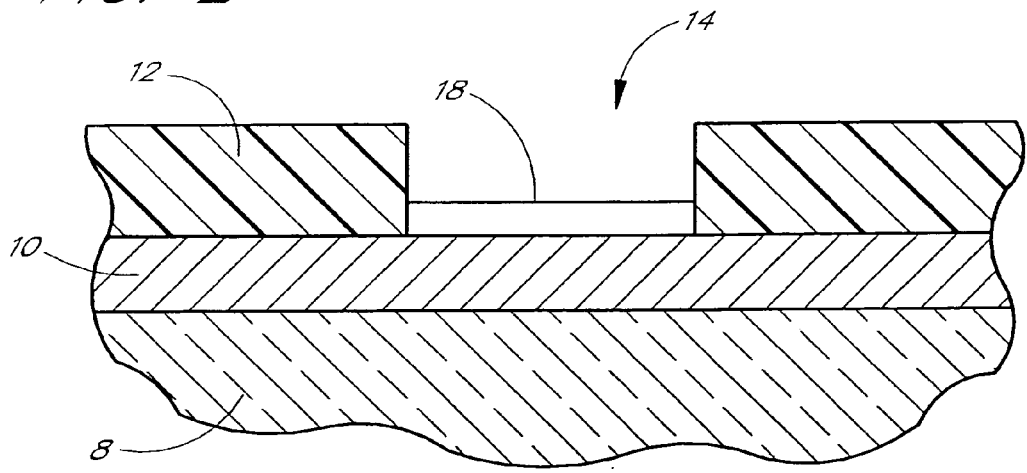
FIG. 3 shows the filled via of FIG. 2 after etching back to recess the Ge—Se glass into the via.

As shown in FIG. 3, the chalcogenide glass layer 16 is etched back to form a recess in the via 14, leaving only a portion 18 of chalcogenide glass remaining in the via 14. The chalcogenide glass is etched back using an isotropic etch, such as a $CF_4$ dry etch or a tetramethyl ammonium hydroxide (TMAH) wet etch.

Figure 4:
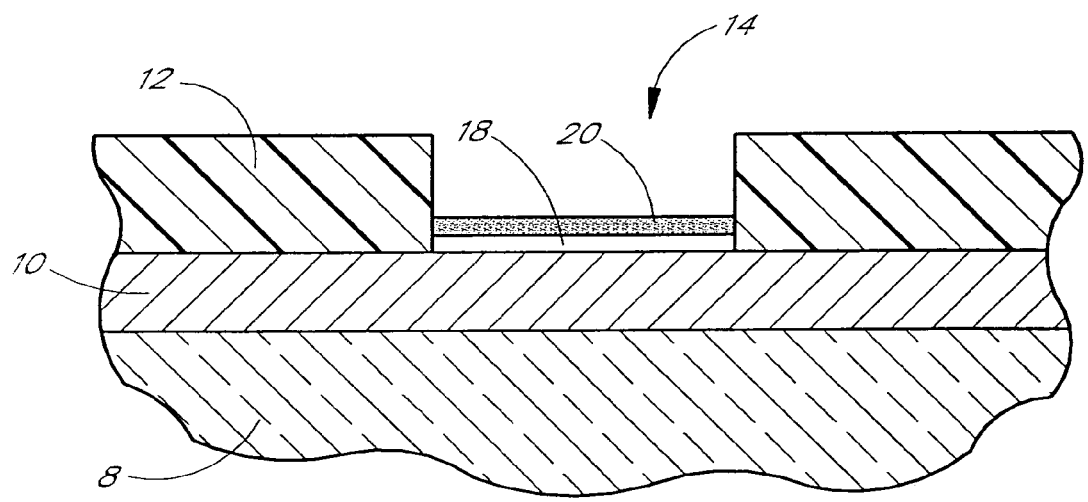
FIG. 4 shows the Ge—Se glass in the via of FIG. 3 after ion implanting to dope a top portion of the Ge—Se layer.

FIG. 4 shows the structure of FIG. 3 after doping a layer 20 of the chalcogenide glass portion 18 in the via 14 to a predetermined depth. In one embodiment, the depth of the doped layer 20 is between about 10 nm and 20 nm. Preferably, doping comprises processing at a temperature less than about 340° C. and to a concentration of between about 0.1 atomic % and 1.0 atomic %. More preferably, doping comprises ion implantation with a species such as bismuth or lead. In the illustrated embodiment, the ion implantation is performed at an energy between about 20 keV and 30 keV at a dose between about $1\times10^{13}$ atoms/$cm^2$ and $1\times10^{14}$ atoms/$cm^2$.

Germanium-selenium or germanium selenide (also referred to as "Ge—Se" herein) is a p-type semiconductor. Doping germanium selenide with bismuth or lead changes the conductivity from p-type to n-type. Thus in the structure of FIG. 4, the bottom, undoped germanium selenide portion 18 and the doped layer 20 have opposite conductivity types and comprise a p-n junction diode.

Figure 5:
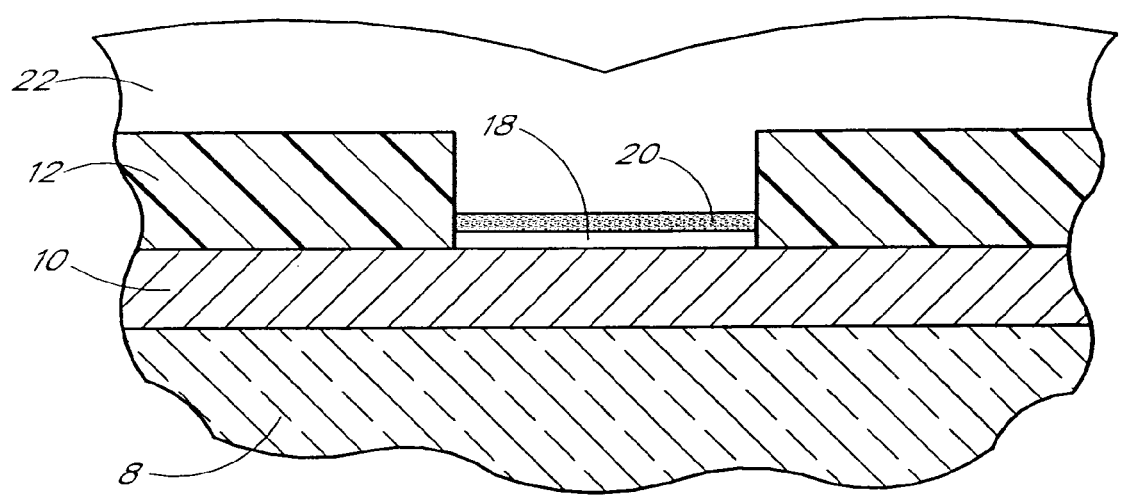
FIG. 5 shows the Ge—Se layer of FIG. 4 after an additional layer of Ge—Se glass has been deposited to fill the via.

In FIG. 5, another chalcogenide glass layer 22 has been deposited, overfilling the via. This layer 22 forms a programmable conductor memory cell and preferably comprises a germanium selenide glass, such as $Ge_2Se_8$ or $Ge_{25}Se_{75}$, with a conductive material, such as metal ions, preferably silver ions, mixed or dissolved therein. In one embodiment, the layer 22 is formed by co-sputtering Ge—Se glass, such as from a pressed powder target, and silver. In other embodiments the Ge—Se glass may be deposited first and then the silver ions diffused therein, such as by photodissolution, as is known in the art of programmable conductor memory cell fabrication. Preferably, the concentration of silver in the chalcogenide glass memory element is between about 20 atomic % and 32 atomic %, more preferably, between about 29 atomic % and 31 atomic %. The skilled artisan can, however, arrive at a desired ratio within or outside these ranges through routine experimentation.

Figure 6A:
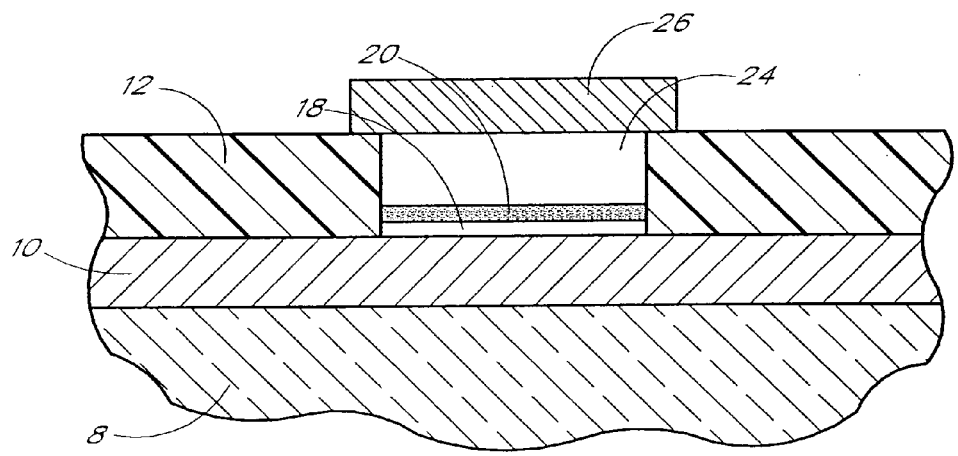
FIG. 6A shows the filled via of FIG. 5 after planarization to make the Ge—Se and the surrounding silicon nitride coplanar and subsequent metal deposition and patterning to make a top electrode, in accordance with one embodiment of the present invention.
Figure 6B:
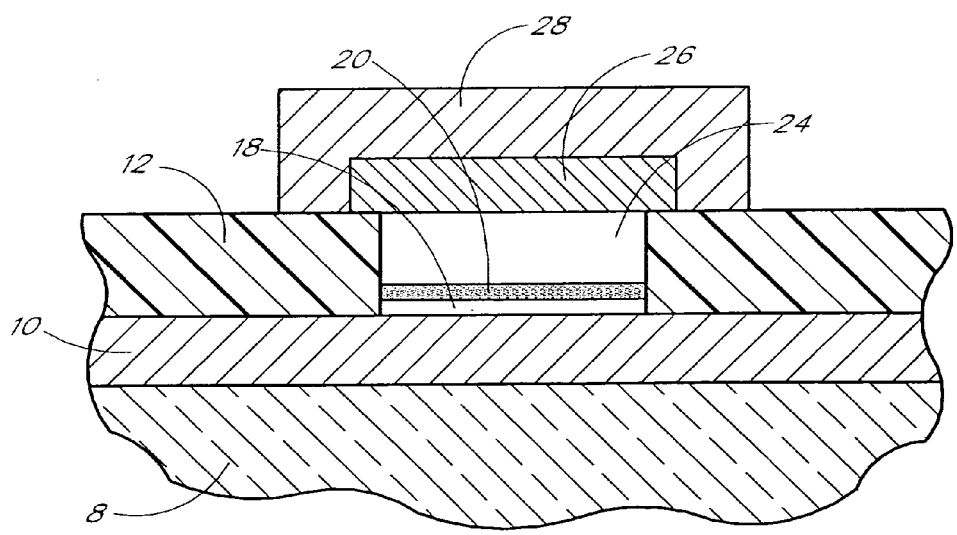
FIG. 6B shows the structure of FIG. 6A after formation of a top conductor.
Figure 7A:
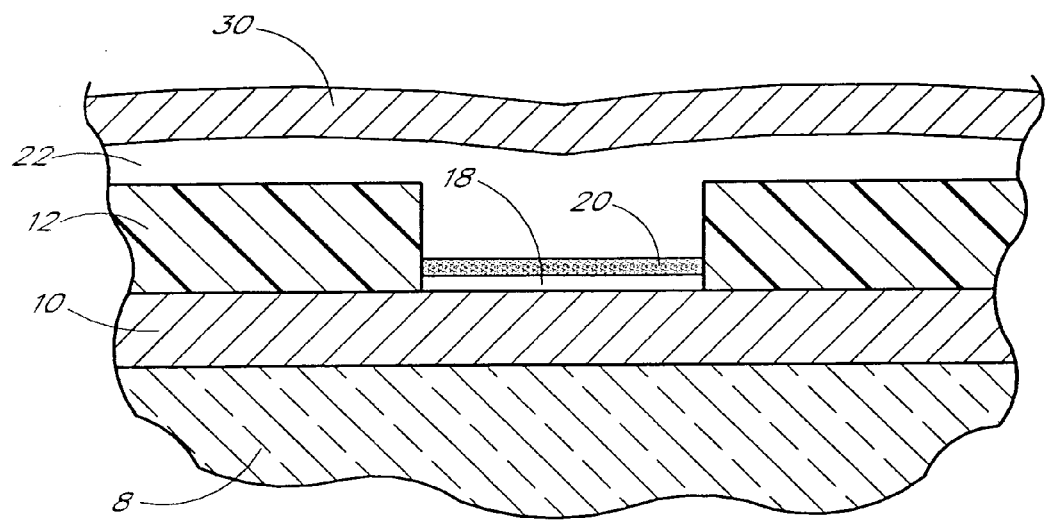
FIG. 7A shows the filled via of FIG. 5 after deposition of a metal layer over the Ge—Se glass, in accordance with another embodiment of the present invention.
Figure 7B:
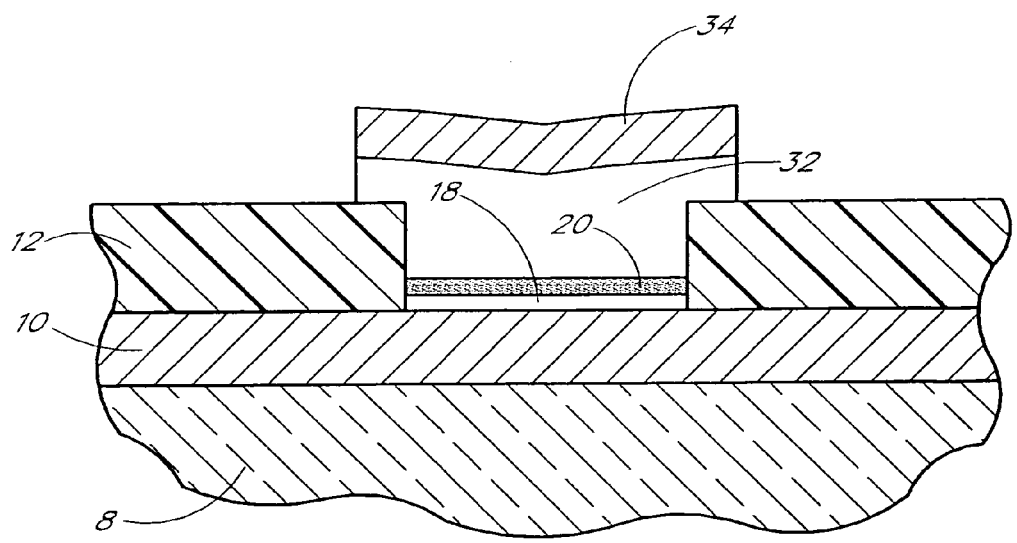
FIG. 7B shows the structure of FIG. 7A after patterning and etching the metal layer and the Ge—Se overlayer.
Figure 7C:
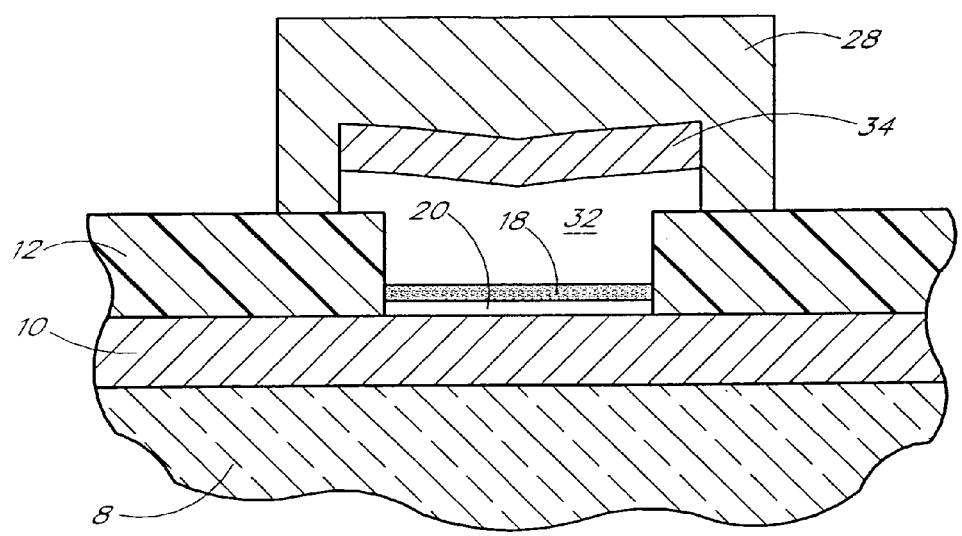
FIG. 7C shows the structure of FIG. 7B after formation of a top conducting line.

There are two illustrated embodiments for completing the integrated programmable conductor memory cell and diode device as described thus far. One embodiment is shown in FIGS. 6A–6B. The other is shown in FIGS. 7A–7C.

In FIG. 6A, the structure of FIG. 5 has been planarized, leaving a programmable conductor chalcogenide glass memory element 24 with metal ions mixed or dissolved therein filling the recess in the via and level with the top surface of the insulating layer 12. A layer of a conducting material, preferably from Group IB or Group IIB, more preferably, silver, has been deposited over the chalcogenide glass element 24 and the insulating layer 12. Preferably, the thickness of the conducting layer is between about 50 nm and 100 nm. The conducting layer has been patterned and etched using standard methods to form a top electrode 26 for the integrated programmable conductor memory cell and diode device. In one aspect of the invention, a diffusion barrier (not shown), such as tungsten nitride, is deposited over the chalcogenide glass element 24 before forming the top electrode 26. A diffusion barrier may also be deposited over the top electrode 26. Another possibility is that the top electrode 26 is a multi-layered structure that includes a diffusion barrier layer as one of its components.

In FIG. 6B, another conducting layer has been deposited, patterned and etched to form a top conducting line 28 extending into and out of the plane of the paper. Preferably the top conducting line 28 comprises tungsten and connects a row of integrated programmable conductor memory cell and diode devices in the memory array. Tungsten also has the advantage of acting as a diffusion barrier for chalcogenide glass species.

FIG. 6B is a cross-section view of an integrated programmable conductor memory cell and diode device in a via that shows the structure of an illustrated embodiment. The device comprises a first diode element 18, having a first conductivity type, a glass electrolyte element 24 having metal ions, such as silver, therein over the first diode element 18 and a top electrode 26 in contact with the glass electrolyte element 24. The structure further comprises a second diode element 20, having a second conductivity type, between the first diode element 18 and the glass electrolyte element 24. In the illustrated embodiment, the diode elements 18, 20 and the programmable conductor memory cell or glass electrolyte element 24 all comprise a chalcogenide glass, such as Ge—Se glass. The first diode element 18 is not intentionally doped and is naturally p-type. The second diode element 20 contains an n-type dopant such as bismuth or lead. Preferably there is a diffusion barrier layer (not shown) comprising titanium between the second diode element 20 and the glass electrolyte element 24. The first diode element 18 is in electrical contact with the bottom conducting line 10. A portion of the bottom conducting line 10 that is directly below and in electrical contact with the first diode element 18 forms a bottom electrode for the integrated programmable conductor memory cell and diode device.

There may also be a diffusion barrier layer (not shown) below the first diode element 18 and a diffusion barrier layer over the chalcogenide glass element 24. In one embodiment, the thickness of the diffusion barrier layer is between about 10 nm and 40 nm. Materials for the diffusion barrier layers include titanium, tungsten and tungsten nitride.

In the second illustrated embodiment for completing the structure of FIG. 5, as shown in FIG. 7A, a layer of a conducting material 30, preferably from Group IB or Group IIB, more preferably silver, has been deposited over the chalcogenide glass layer 22. Preferably, the thickness of the conducting layer is between about 50 nm and 100 nm. In FIG. 7B, both the conducting layer and the chalcogenide glass layer have been patterned and etched to form a programmable conductor chalcogenide glass memory element 32 with metal ions mixed or dissolved therein and an electrode 34 for the integrated programmable conductor memory cell and diode device.

In FIG. 7C, another conducting layer has been deposited, patterned and etched to form a top conducting line 28 extending into and out of the plane of the page. Preferably the top conducting line 28 comprises tungsten and connects a row of integrated programmable conductor memory cell and diode devices in the memory array.

FIG. 7C is a cross-section view of an integrated programmable conductor memory cell and diode device in a via that shows the structure of an illustrated embodiment. The device comprises a first diode element 18, having a first conductivity type, a glass electrolyte element 32 having metal ions, such as silver, mixed or dissolved therein over the first diode element 18 and a top electrode 34 in contact with the glass electrolyte element 32. The structure further comprises a second diode element 20, having a second conductivity type, between the first diode element 18 and the glass electrolyte element 32. In one embodiment, the diode elements 18, 20 and the programmable conductor memory cell or glass electrolyte element 32 all comprise a chalcogenide glass, such as Ge—Se glass. The first diode element 18 is not intentionally doped, and is naturally p-type. The second diode element 20 contains an n-type dopant such as bismuth or lead. Preferably there is a diffusion barrier layer (not shown) comprising titanium between the second diode element 20 and the glass electrolyte element 24.

There may also be a diffusion barrier layer (not shown) below the first diode element 18 and a diffusion barrier layer over the chalcogenide glass element 32. In one embodiment, the thickness of the diffusion barrier layer is between about 10 nm and 40 nm. Materials for the diffusion barrier layers include titanium, tungsten and tungsten nitride.

Figure 8:
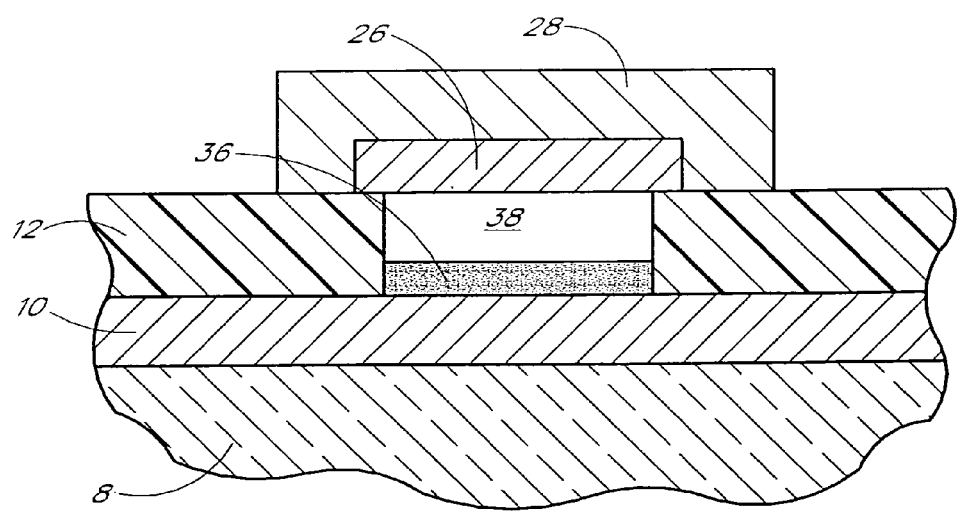
FIG. 8 is a cross section showing another embodiment of the invention wherein an integrated programmable conductor memory cell and diode device comprises a Ge—Se doped layer extending down to a bottom conducting line and overlaid by an undoped layer of Ge—Se glass.

In another embodiment of the current invention and with reference again to FIG. 4, the entire thickness of the chalcogenide glass portion 18 is doped. This embodiment is shown in FIG. 8. The doped chalcogenide glass layer 36 extends down to the bottom conducting line 10 or a diffusion barrier layer thereover (not shown) and forms the first diode element. Hereinafter, processing proceeds much as described for the embodiment in FIGS. 5, 6A and 6B.

Another chalcogenide glass layer is deposited, overfilling the via. The structure is planarized, leaving the chalcogenide glass layer 38 with metal ions therein filling the recess in the via and level with the top surface of the insulating layer 12. This layer 38 functions both as the second diode element in contact with the first diode element 36 and as the programmable conductor memory element and preferably comprises a germanium selenide glass, such as $Ge_2Se_8$ or $Ge_{25}Se_{75}$, with a conductive material, such as metal ions, preferably silver ions, mixed or dissolved therein. A layer of a conducting material, preferably from Group IB or Group IIB, more preferably, silver, is deposited over the chalcogenide glass element 38 and the insulating layer 12. Preferably, the thickness of the conducting layer is between about 50 nm and 100 nm. Using standard methods, the conducting layer is patterned and etched to form a top electrode 26 for the integrated programmable conductor memory cell and diode device.

In one aspect of the invention, a diffusion barrier (not shown), such as tungsten nitride, is deposited over the chalcogenide glass element 38 before forming the top electrode 26. Alternatively, a diffusion barrier may be deposited over the top electrode 26. Another possibility is that the top electrode 26 is a multi-layered structure that includes a diffusion barrier layer as one of its components. A second conducting layer is deposited, patterned and etched to form a top conducting line 28 extending into and out of the plane of the page. Preferably the top conducting line 28 comprises tungsten and connects a row of integrated programmable conductor memory cell and diode devices in the memory array. Tungsten also has the advantage of acting as a diffusion barrier for chalcogenide glass species.

FIG. 8 is a cross-section view of an integrated programmable conductor memory cell and diode device in a via that shows the structure of an illustrated embodiment. The integrated PCRAM (memory and diode device) 36, 38 is formed in a via in an insulating layer 12, preferably silicon nitride. A conducting line 10 comprising a metal such as tungsten, extends along the bottom of the via and off the edges of the page. There may be first diffusion barrier layer (not shown) between the conducting line 10 and the first layer of chalcogenide glass 36.

The first layer of chalcogenide glass 36 has n-type doping from a dopant such as bismuth or lead. A second layer of chalcogenide glass 38, infused with silver, is in contact with the first layer of chalcogenide glass 36. In one arrangement, the chalcogenide glass is $Ge_2Se_8$ or $Ge_{25}Se_{75}$. The two layers 36, 38 comprise a p-n junction, and the second layer 38 functions also as a programmable conductor memory element. A top electrode layer 26 lies over the second chalcogenide glass layer 38 and may comprise silver. A conducting line 28, extending into and out of the page is in contact with the electrode 26. In one aspect of the invention, the conducting line 28 comprises tungsten and acts also as a diffusion barrier. In another aspect of the invention, a separate diffusion barrier layer (not shown) is used either below or above the electrode 26. Another embodiment of the invention can be described starting with the structure of FIG. 1. As discussed above, a bottom conducting line 10 overlies a substrate 8. Using standard techniques, an array of vias is patterned and etched into the insulating layer 12. One via 14 is shown in FIG. 1. It is in this via that the programmable conductor memory cell of this embodiment will be constructed.

Figure 9:
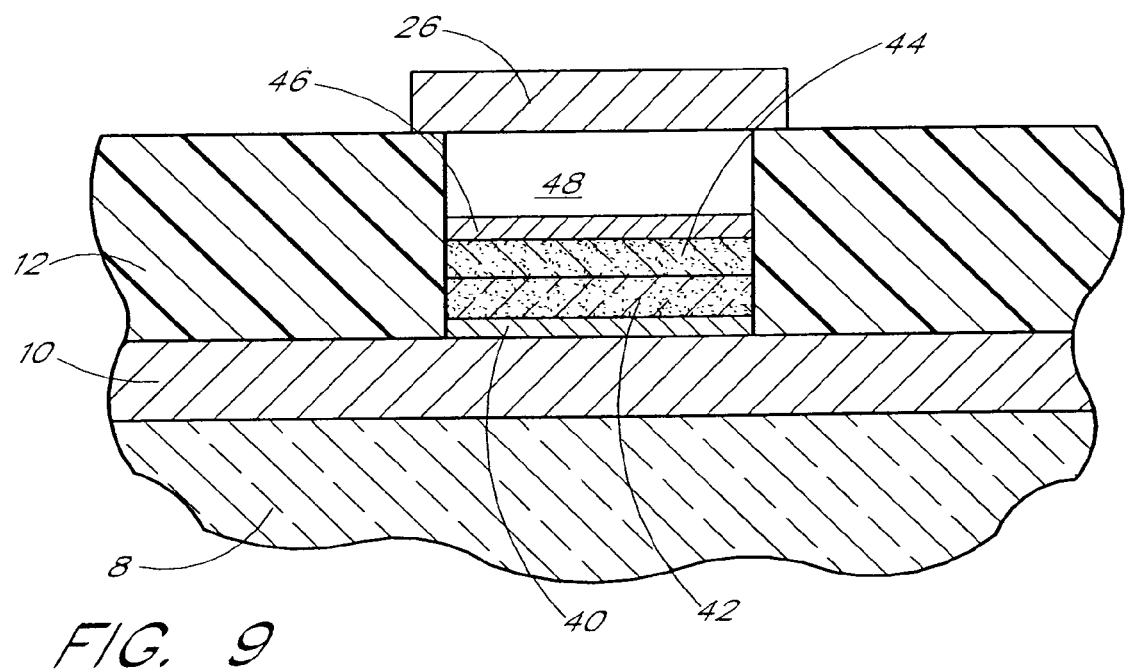
FIG. 9 is a cross section showing another embodiment of the invention wherein a diode comprises a $p^+$ polysilicon layer and an $n^+$ polysilicon layer, integrated with a programmable conductor memory cell.

With reference to FIG. 9, a layer of tungsten silicide 40 is deposited at the bottom of the via. A first diode element 42, preferably comprising a doped polysilicon layer having a first type conductivity, is deposited over the tungsten silicide layer 40. A second diode element 44, preferably comprising a doped polysilicon layer having a second type conductivity, opposite to the first type conductivity, is deposited over the first diode element 42. The two polysilicon layers 42, 44, having opposite conductivity types, form a polysilicon diode.

A diffusion barrier layer 46, preferably comprising tungsten nitride, is deposited over the second diode element 44. A chalcogenide glass element 48, preferably a germanium selenide glass with metal ions, preferably silver ions, mixed or dissolved therein, is formed by depositing the glass over the diffusion barrier layer 46 and then planarizing the glass layer to make it level with the top surface of the insulating layer 12. A layer of a conducting material, preferably from Group IB or Group IIB, more preferably, silver, has been deposited over the chalcogenide glass element 48 and the insulating layer 12. Preferably, the thickness of the conducting layer is between about 50 nm and 100 nm. The conducting layer has been patterned and etched using standard methods to form a top electrode 26 for the integrated programmable conductor memory cell and polysilicon diode device. Preferably a diffusion barrier (not shown), more preferably, tungsten nitride, is deposited over the chalcogenide glass element 48 before forming the top electrode 26. Finally, although not shown in FIG. 9, a conducting line may be provided as described above with reference to FIGS. 6B and 7C.

FIG. 9 is a cross-section view of an integrated programmable conductor memory cell and diode device that shows the structure of an illustrated embodiment. The first polysilicon layer 42, having a first conductivity type doping, lies in a via in an insulating layer 12. There is a second polysilicon layer 44, having a second conductivity type doping, opposite to the first conductivity type, between the first polysilicon layer 42 and a diffusion barrier layer 46. For example, the first polysilicon layer 42 may have p-type doping, and the second polysilicon layer 44 may have n-type doping. There is a layer of germanium selenide glass 48, containing metal ions, over the diffusion barrier layer 46. There is a top electrode 26 over the germanium selenide glass 48. The top electrode 26 may comprise both a conducting layer and a diffusion barrier layer.

Figure 10:
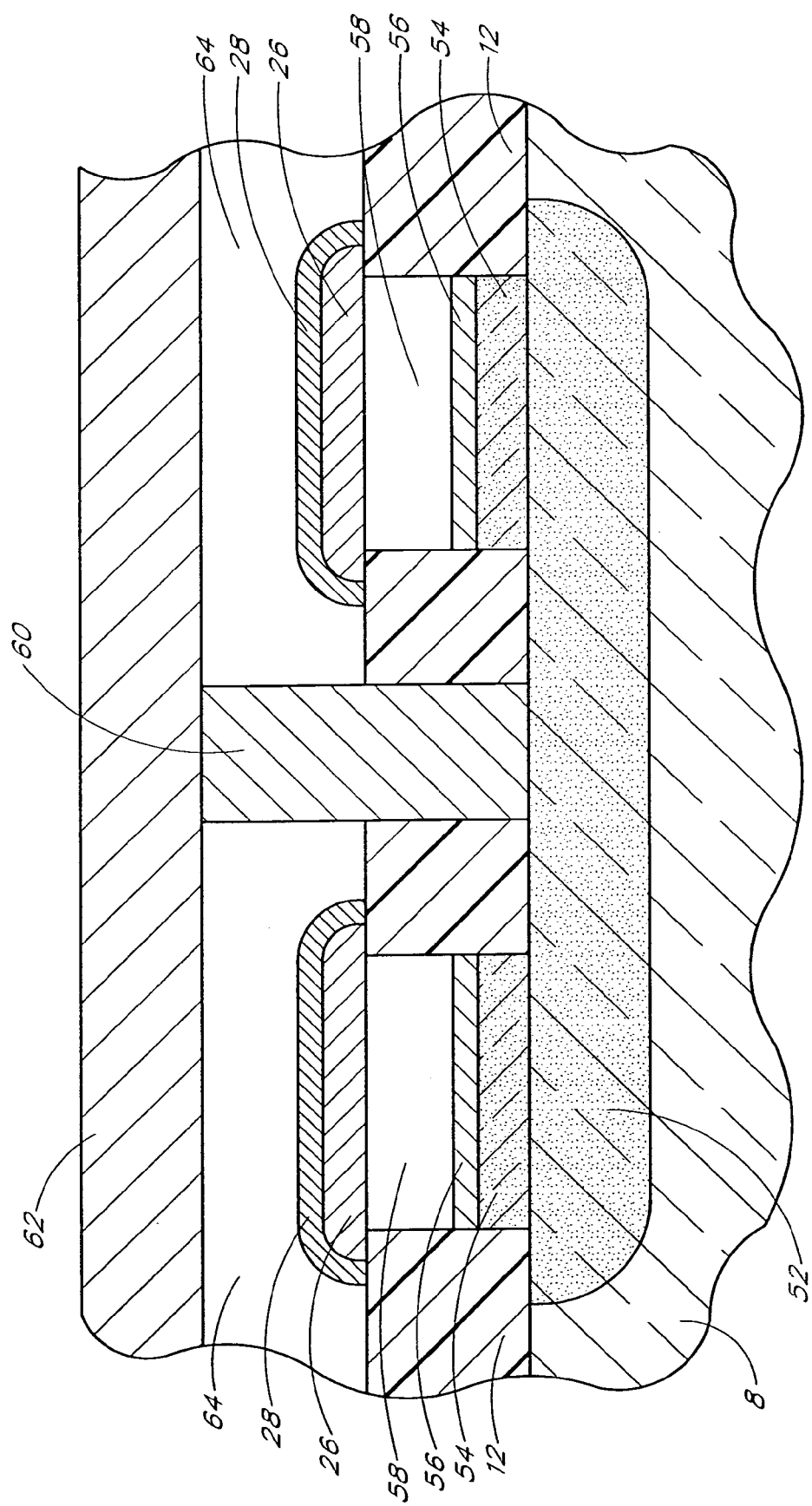
FIG. 10 is a cross section showing another embodiment of the invention wherein two integrated programmable conductor memory cell and diode devices are shown. A silicon nitride layer having two vias has been formed directly on a silicon substrate. The diodes comprise the underlying $p^+$ region of the substrate and $n^+$ polysilicon layers at the bottom of the vias.

Another aspect of the invention can be described with reference to FIG. 10. A silicon substrate 8 is shown with a region 52 doped to have a first type conductivity, preferably $p^+$. The region 52 forms the first diode element.

A layer of an insulating material 12 has been deposited over the substrate 8. Preferably the insulating layer 12 has a thickness between about 50 nm and 150 nm, more preferably between about 95 nm and 105 nm. The insulating material 12 may be any insulating material that does not interact adversely with the materials used in the programmable conductor memory cell or in the diode and that has enough structural integrity to support a cell formed in a via therein. Suitable materials include oxides and nitrides. Preferably the insulating layer 12 comprises silicon nitride. Using standard techniques, an array of vias is patterned and etched into the insulating layer 12. Two such vias, containing integrated programmable conductor memory cell and diode devices are shown in FIG. 10.

A polysilicon layer 54, having a second conductivity type, preferably $n^+$, opposite to the first conductivity type of the doped region 52, is deposited into the via in contact with the doped region 52 of the substrate 8. Polysilicon layer 54 forms the second diode elements and, together with doped region 52, forms p-n junction diodes.

Diffusion barrier layers 56, preferably comprising tungsten nitride, are deposited over the second diode elements 54. Chalcogenide glass elements 58, preferably germanium selenide glass with metal ions, preferably silver ions, mixed or dissolved therein, are formed by depositing the glass over the diffusion barrier layers 56 and then planarizing the glass to make it level with the top surface of the insulating layer 12. A layer of a conducting material, preferably from Group IB or Group IIB, more preferably, silver, is deposited over the chalcogenide glass elements 58 and the insulating layer 12. Preferably, the thickness of the conducting layer is between about 50 nm and 100 nm. The conducting layer is patterned and etched using standard methods to form top electrodes 26 for the integrated programmable conductor memory cell and polysilicon diode devices 58, 52, 54. Preferably a diffusion barrier (not shown), more preferably, tungsten nitride, is deposited over the chalcogenide glass elements 58 before forming the top electrodes 26.

A conducting line 28, extending into and out of the page, is in contact with the electrode 26. A conductive plug 60, preferably comprising polysilicon or a metal such as tungsten, makes contact to the doped silicon substrate region 52 and to conducting line 62, thus providing electrical connections for the integrated programmable conductor memory cell and diode device of FIG. 10. Conducting line 62 is insulated from conducting line 28 by layer 64, preferably comprising BPSG (borophosphosilicate glass).

Figure 11:
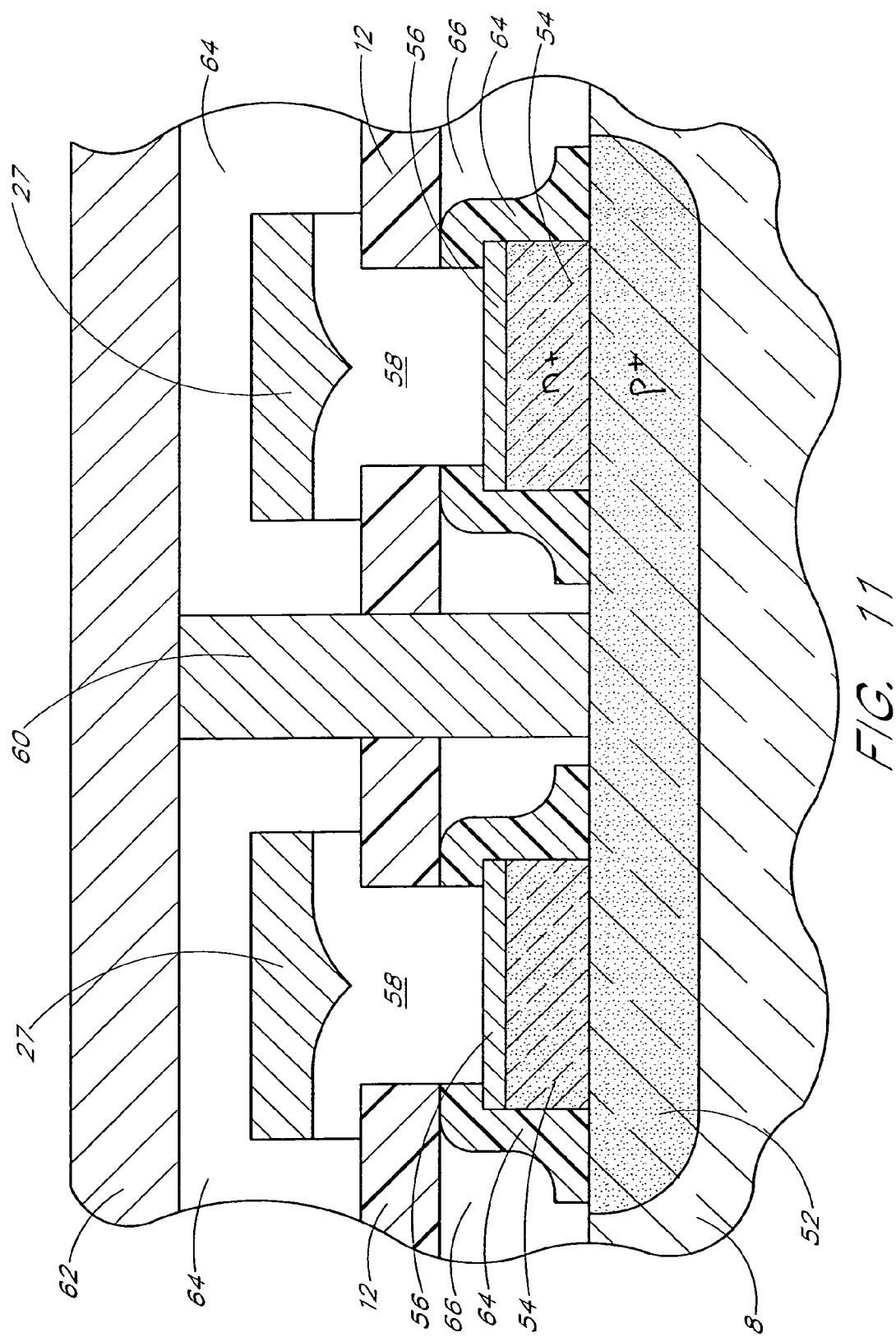
FIG. 11 is a cross section showing an alternative arrangement of the embodiment of FIG. 10 wherein first $n^+$ polysilicon layers are formed in contact with an underlying $p^+$ region of the substrate, and then narrower programmable conductor memory cells are formed in vias in a silicon nitride layer to land on the top surfaces of the diode structures.

Another aspect of the invention can be described with reference to FIG. 11. A silicon substrate 8 is shown with a region 52 doped to have a first conductivity type, preferably $p^+$. The region 52 forms the first diode elements for integrated programmable conductor memory cell and diode devices.

A layer of polysilicon with conductivity, preferably $n^+$, opposite to the conductivity of the doped region 52 of the substrate 8 is deposited. The polysilicon layer is patterned and etched to form the second diode elements 54. Preferably, a diffusion barrier layer, such as tungsten, tungsten nitride or titanium, is deposited onto the polysilicon layer and then patterned and etched with the polysilicon layer, thus forming diffusion barrier layers 56 over the second diode elements 54.

A layer of material 64, preferably silicon nitride, is deposited conformally onto the second diode elements 54 and diffusion barrier layers 56 to act as an etch stop for a subsequent chemical-mechanical planarization step. An insulating layer 66, preferably comprising silicon oxide formed from TEOS, is deposited to a thickness that at least covers the top surface of layer 64. Chemical-mechanical planarization is performed until the top portions of layer 64 are exposed to make a flat top surface for silicon oxide layer 66. The exposed portions of layer 64 are patterned and etched to expose at least a portion of a top surface of the diffusion barrier layer 56.

A layer of insulating material 12, preferably silicon nitride, is deposited over the silicon oxide layer 66. The layer 12 is patterned and etched to form vias down through layer 64 and onto diffusion barrier layer 56. A chalcogenide glass layer is deposited, overfilling the vias. The chalcogenide glass forms the programmable conductor memory cells 58 and preferably comprises a germanium selenide glass, such as $Ge_2Se_8$ or $Ge_{25}Se_{75}$, with a conductive material, such as metal ions, preferably silver ions, mixed or dissolved therein. In one embodiment, the glass is formed by co-sputtering Ge—Se glass, such as from a pressed powder target, and silver. In other embodiments the Ge—Se glass may be deposited first and then the silver ions diffused therein, such as by photodissolution, as is known in the art of programmable conductor memory cell fabrication. Preferably, the concentration of silver in the chalcogenide glass memory element is between about 20 atomic % and 36 atomic %, more preferably, between about 29 atomic % and 32 atomic %.

A layer of a conducting material 27, preferably from Group IB or Group IIB, more preferably silver, is deposited over the chalcogenide glass layer 58. Preferably, the thickness of the conducting layer is between about 50 nm and 100 nm. Both the conducting layer 27 and the chalcogenide glass layer 58 are patterned and etched to form programmable conductor chalcogenide glass memory elements 58 with metal ions mixed or dissolved therein and electrodes and conducting lines 27 for the memory cells 58.

A layer of insulating material 64, preferably comprising BPSG (borophosphosilicate glass), is deposited over the conducting lines 27 and planarized. A via is etched through insulating layers 64, 12 and 66, down to expose a portion of the doped region 52 of the substrate 8. The via is filled with conducting material, preferably polysilicon or a metal such as tungsten, thus forming a conductive plug 60 that makes contact to the doped silicon substrate region 52. A conductive line, preferably comprising aluminum or copper, is formed over the BPSG 64 and makes contact with the conductive plug 60, and thus to the diodes in the integrated programmable conductor memory cell and diode devices.

This invention has been described herein in considerable detail to provide those skilled in the art with the information needed to apply the novel principles and to construct and use such specialized components as are required. However, it is to be understood that the invention can be carried out by specifically different equipment and devices, and that various modifications, both as to the structure and as to the method of fabricating the structure, can be accomplished without departing from the scope of the invention itself.

I claim:

1. A method for making a variable resistance memory cell with an integrated thin film diode in a via, comprising:
   providing a diffusion barrier material at a bottom of the via;
   depositing a first chalcogenide glass to fill the via;
   etching the first chalcogenide glass back to form a recess in the via;
   doping the first chalcogenide glass to a depth after etching;
   forming a mixture of a second chalcogenide glass and a first conductive material to fill the via after doping; and
   depositing a second conductive material over the mixture.

2. The method of claim 1, wherein the first chalcogenide glass and the second chalcogenide glass each comprise germanium (Ge) and selenium (Se).

3. The method of claim 2, wherein the first chalcogenide glass and the second chalcogenide glass comprise $Ge_2Se_8$ or $Ge_{25}Se_{75}$.

4. The method of claim 1, wherein the first chalcogenide glass is deposited by sputtering.

5. The method of claim 1, wherein the first chalcogenide glass is deposited by evaporating.

6. The method of claim 1, wherein etching the first chalcogenide glass back comprises an isotropic etch.

7. The method of claim 6, wherein the isotropic etch comprises a $CF_4$ dry etch.

8. The method of claim 6, wherein the isotropic etch is an aqueous base.

9. The method of claim 6, wherein the isotropic etch comprises tetramethyl ammonium hydroxide (TMAH).

10. The method of claim 6, wherein the isotropic etch comprises ammonium hydroxide.

11. The method of claim 1, wherein doping the first chalcogenide glass comprises processing at a temperature less than about 340° C.

12. The method of claim 11, wherein doping the first chalcogenide glass comprises ion implantation.

13. The method of claim 12, wherein ion implantation comprises a species selected from the group consisting of bismuth and lead.

14. The method of claim 13, wherein the ion implantation is performed at an energy between about 20 keV and 30 keV at a dose between about $1 \times 10^{13}$ atoms/$CM^2$ and $1 \times 10^{14}$ atoms/$CM^2$.

15. The method of claim 11, wherein doping the first chalcogenide glass to a depth comprises doping to a depth of between about 10 nm and 20 nm, thereby forming a p-n junction with the underlying chalcogenide glass.

16. The method of claim 11, wherein doping the first chalcogenide glass to a depth comprises doping through an entire depth of the chalcogenide glass, thereby forming a p-n junction at a boundary of the first, doped chalcogenide glass and the mixture of the second chalcogenide glass and the first conductive material.

17. The method of claim 1, wherein forming the mixture of the second chalcogenide glass and the first conductive material comprises co-sputtering germanium selenide from a pressed powder target and silver from a silver target.

18. The method of claim 1, wherein depositing the second conductive material over the mixture of the second chalcogenide glass and the first conductive material comprises depositing a layer of second conductive material selected from the group consisting of Group IB or Group IIB metals to a thickness of about 50 nm to about 100 nm.

19. The method of claim 18, wherein both the first conductive material and the second conductive material comprise silver.

20. The method of claim 19, further comprising patterning the second conductive material to form a top electrode for the variable resistance memory cell.

21. The method of claim 20, further comprising providing conducting lines, in contact with the top electrode for the variable resistance memory cell and providing connections to other variable resistance memory cells.

22. The method of claim 21, wherein the conducting lines comprise tungsten.

23. A method of fabricating a programmable memory device wherein each memory cell has an ancillary diode, comprising:
    etching a via in a silicon nitride layer over a tungsten region;
    filling the via with germanium selenide (Ge—Se);
    etching back the Ge—Se to form a recess in the via;
    ion implanting the Ge—Se with bismuth;
    co-sputtering a mixture of Ge—Se and silver (Ag)
    depositing and patterning a silver layer onto the mixture of Ge—Se and Ag to form a top electrode; and
    depositing a top conducting layer of tungsten.

24. A method of forming a memory cell, comprising:
    providing a polysilicon diode;
    forming a diffusion barrier layer over the polysilicon diode;
    depositing germanium selenide glass over the diffusion barrier layer; and
    infusing the germanium selenide glass with metal ions.

* * * * *

UNITED STATES PATENT AND TRADEMARK OFFICE
CERTIFICATE OF CORRECTION

PATENT NO.       : 7,112,484 B2
APPLICATION NO.  : 11/003733
DATED            : September 26, 2006
INVENTOR(S)      : Terry L. Gilton It is certified that error appears in the above-identified patent and that said Letters Patent is hereby corrected as shown below:

On the title page (56) in the Other References portion of the References Cited section, the following errors are corrected:

"Cehn, G.; Cheng, J.; Chen, W., Effect of $Si_3N_4$ on chemical durability of chalcogenide glass, J. Non-Cryst. Solids 220 (1997) 249-253."

Should read

--Chen, G.; Cheng, J.; Chen, W., Effect of $Si_3N_4$ on chemical durability of chalcogenide glass, J. Non-Cryst. Solids 220 (1997) 249-253.--;

"Deamaley, G.; Stoneham, A.M.; Morgan, D.V., Electrical phenomena in amorphous oxide films, Rep. Prog. Phys. 33 (1970) 1129-1191."

Should read

--Dearnaley, G; Stoneham, A.M.; Morgan D.V., Electrical phenomena in amorphous oxide films, Rep. Prog. Phys. 33 (1970) 1129-1191.--;

"Haberland, D.R.; Steigler, H., New experiments on the charge-controlled switching effect in amorphous semiconductors, John Non-Cryst. Solids 8-10 (1972) 408-414."

Should read

--Haberland, D.R.; Steigler, H., New experiments on the charge-controlled switching effect in amorphous semiconductors, J. Non-Cryst. Solids 8-10 (1972) 408-414.--; and

UNITED STATES PATENT AND TRADEMARK OFFICE
CERTIFICATE OF CORRECTION

PATENT NO. : 7,112,484 B2
APPLICATION NO. : 11/003733
DATED : September 26, 2006
INVENTOR(S) : Terry L. Gilton It is certified that error appears in the above-identified patent and that said Letters Patent is hereby corrected as shown below:

"Zhang, M.; Mancini, S.; Bresser, W.; Boolchand, P., Variation of glass transition temperature, Tg, with average coordination number, <m>, in network glasses: evidence of a threshold behavior in the slope □dTg/d<m>at the rigidity percolation threshold (<m>=2.4), J. Non-Cryst. Solids 151 (1992) 159-154."

Should read

--Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non-Cryst. Solids 151 (1992) 159-154.--

Signed and Sealed this

Sixteenth Day of January, 2007

JON W. DUDAS
*Director of the United States Patent and Trademark Office*